US006967161B2

(12) United States Patent
Fumitake et al.

(10) Patent No.: US 6,967,161 B2
(45) Date of Patent: Nov. 22, 2005

(54) METHOD AND RESULTING STRUCTURE FOR FABRICATING DRAM CELL STRUCTURE USING OXIDE LINE SPACER

(75) Inventors: Mieno Fumitake, Shanghai (CN); Bong Jae Lee, Shanghai (CN); Guoqing Chen, Shanghai (CN)

(73) Assignee: Semiconductor Manufacturing International (Shangai) Corporation, (CN)

( * ) Notice: Subject to any disclaimer, the term of this patent is extended or adjusted under 35 U.S.C. 154(b) by 0 days.

(21) Appl. No.: 10/773,799

(22) Filed: Feb. 6, 2004

(65) Prior Publication Data

US 2005/0142740 A1    Jun. 30, 2005

(30) Foreign Application Priority Data

Dec. 30, 2003  (CN) .................... 200310122973 A

(51) Int. Cl.$^7$ ............................................. H01L 21/44
(52) U.S. Cl. .................. 438/675; 438/672; 257/774
(58) Field of Search ................................ 257/303–306, 257/314–319, 750–758, 774, 781; 438/238, 438/253, 381, 396–399, 669–675, 233

(56) References Cited

U.S. PATENT DOCUMENTS 6,242,332 B1 *  6/2001  Cho et al. .................... 438/587
6,576,963 B2 *  6/2003  Jin et al. ..................... 257/388

OTHER PUBLICATIONS

Jung et al., A Fully Working 0.14 μm DRAM technology with polymetal (W/WNx/Poly-Si) gate, IEEE, 2000.

* cited by examiner

Primary Examiner—David Nelms
Assistant Examiner—Calvin Lee
(74) Attorney, Agent, or Firm—Townsend and Townsend and Crew, LLP

(57) ABSTRACT

A method for forming bit line and storage node contacts for a dynamic random access device, e.g., DRAM. Other devices (e.g., Flash, EEPROM) may also be included. The method includes providing a substrate, which has a bit line region and a capacitor contact region. The method also includes forming at least a first gate structure and a second gate structure overlying the substrate. The first gate structure and the second gate structure include an overlying cap. The method also includes forming a conformal dielectric layer overlying the first gate structure, the second gate structure, the bit line region, and the capacitor contact region. The method includes forming an interlayer dielectric material overlying the conformal dielectric layer and planarizing the interlayer dielectric material. The method includes forming a masking layer overlying the planarized interlayer dielectric material and exposing a continuous common region within a portion of the planarized interlayer dielectric material overlying a portion of the first gate structure, a portion of the second gate structure, a portion of the bit line region, and a portion of the capacitor contact region. A first etching process is performed to remove the exposed portion of the planarized interlayer dielectric layer. A second etching process is performed to remove a portion of the conformal dielectric layer on the bit line region and to remove a portion of the conformal dielectric layer on the capacitor contact region while using other portions of the conformal layer as a mask to prevent a portion of the first gate structure and a portion of the second gate structure from being exposed. The method deposits a polysilicon fill material within the continuous common region and overlying the bit line region, the capacitor contact region, the first gate structure, and the second gate structure to cover portions of the bit line region, the capacitor contact region, the first gate structure, and the second gate structure to a predetermined thickness. The method includes planarizing the polysilicon fill material to reduce the predetermined thickness and to simultaneously reduce a thickness of a portion of the interlayer dielectric material.

19 Claims, 9 Drawing Sheets

METHOD AND RESULTING STRUCTURE FOR FABRICATING DRAM CELL STRUCTURE USING OXIDE LINE SPACER

BACKGROUND OF THE INVENTION

The present invention is directed to integrated circuits and their processing for the manufacture of semiconductor devices. More particularly, the invention provides a method and structures for manufacturing an interconnect structure having for dynamic random access memory devices, commonly called DRAMs. But it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process limitations exist with certain conventional processes and materials.

An example of such a process is the manufacture of an interconnect structure for memory devices. Such interconnect structures include, among others, plugs, metallization, and other designs. Although there have been significant improvements, such designs still have many limitations. As merely an example, these designs must become smaller and smaller but still require precise alignment to certain contact points. Additionally, these interconnect designs are often difficult to manufacture and generally require complex manufacturing processes and structures, which lead to inefficiencies and may cause low yields from "opens" or "shorts." These and other limitations will be described in further detail throughout the present specification and more particularly below.

From the above, it is seen that an improved technique for processing semiconductor devices is desired.

BRIEF SUMMARY OF THE INVENTION

According to the present invention, techniques for processing integrated circuits for the manufacture of semiconductor devices are provided. More particularly, the invention provides a method and structures for manufacturing an interconnect structure having for dynamic random access memory devices, commonly called DRAMs. But it would be recognized that the invention has a much broader range of applicability In a specific embodiment, the invention provides a method for forming bit line and storage node contacts for a dynamic random access device, e.g., DRAM. Other devices (e.g., Flash, EEPROM) may also be included. The method includes providing a substrate, which has a bit line region and a capacitor contact region. The method also includes forming at least a first gate structure and a second gate structure overlying the substrate. The first gate structure and the second gate structure include an overlying cap. The first gate structure is spaced by the bit line region to the second gate structure. The capacitor contact region is coupled to the first gate structure. The method also includes forming a conformal dielectric layer overlying the first gate structure, the second gate structure, the bit line region, and the capacitor contact region. The method includes forming an interlayer dielectric material overlying the conformal dielectric layer and planarizing the interlayer dielectric material. The method includes forming a masking layer overlying the planarized interlayer dielectric material and exposing a continuous common region within a portion of the planarized interlayer dielectric material overlying a portion of the first gate structure, a portion of the second gate structure, a portion of the bit line region, and a portion of the capacitor contact region. A first etching process is performed to remove the exposed portion of the planarized interlayer dielectric layer. A second etching process is performed to remove a portion of the conformal dielectric layer on the bit line region and to remove a portion of the conformal dielectric layer on the capacitor contact region while using other portions of the conformal layer as a mask to prevent a portion of the first gate structure and a portion of the second gate structure from being exposed. The method deposits a polysilicon fill material within the continuous common region and overlying the bit line region, the capacitor contact region, the first gate structure, and the second gate structure to cover portions of the bit line region, the capacitor contact region, the first gate structure, and the second gate structure to a predetermined thickness. The method includes planarizing the polysilicon fill material to reduce the predetermined thickness and to simultaneously reduce a thickness of a portion of the interlayer dielectric material. The method continues the planarization of the polysilicon fill material and the interlayer dielectric material. The method exposes a portion of the first gate structure and a portion of the second gate structure while leaving portions of the polysilicon fill material on the portion of the capacitor contact region and the portion of the bit line region, whereupon the polysilicon fill material on the portion of the capacitor contact region is isolated from the polysilicon fill material on the portion of the bit line region.

In an alternative specific embodiment, the invention provides an alternative method for forming a self aligned contact region for a dynamic random access memory device. The method includes providing a semiconductor substrate, which has a cell region and a peripheral region. The method forms at least a first gate structure, a second gate structure, a third gate structure, and a fourth gate structure in the cell region and forms a gate structure in the peripheral region. Each of the gate structures has an overlying cap layer, which protects it. The second gate structure is spaced by a bit line region to the third gate structure. The first gate structure is spaced by a first capacitor contact region to the second gate structure. The third gate structure is spaced by a second capacitor contact region to the fourth gate structure. The method forms a conformal dielectric layer overlying the first gate structure, the second gate structure, the third gate structure, the fourth gate structure, the bit line region, the first capacitor contact region, and the second capacitor contact region in the cell region and the gate structure in the peripheral region. The method includes forming an interlayer dielectric material overlying the conformal dielectric layer and planarizing the interlayer dielectric material. A masking layer is formed overlying the planarized interlayer dielectric material. The method exposes a continuous common region within a portion of the planarized interlayer dielectric material overlying the first gate structure, the second gate structure, the third gate structure, the fourth gate structure, the bit line region, the first capacitor contact region, and the second capacitor contact region while maintaining the planarized interlayer dielectric material overlying the gate structure in the peripheral region. The method includes performing an etching process to remove the exposed portion of the planarized interlayer dielectric layer in the continuous common region to expose the bit line contact, the first capacitor contact region, and the second capacitor contact region while using portions of the conformal layer as a mask to prevent any conductive portions of the first gate structure, the second gate structure, the third gate structure, and the fourth gate structure from being exposed. The method deposits a polysilicon fill material within the continuous common region and overlying the bit line region, the first capacitor contact region, and the second capacitor region, the first gate structure, the second gate structure, the third gate structure, and the fourth gate structure to a predetermined thickness. The polysilicon fill material is planarized to reduce the predetermined thickness and to simultaneously reduce a thickness of a portion of the interlayer dielectric material to a vicinity of an upper region of the first gate structure, the second gate structure, the third gate structure, the fourth gate structure, and the gate structure. The method continues the planarization of the polysilicon fill material and the interlayer dielectric material to expose a portion of the first gate structure, a portion of the second gate structure, a portion of the third gate structure, a portion of the fourth gate structure, and a portion of the gate structure while leaving portions of the polysilicon fill material on the bit line region, the first capacitor contact region and the second capacitor contact region. The polysilicon fill material on the first capacitor contact region is isolated from the polysilicon fill material on the bit line region and the polysilicon fill material on the second capacitor contact region is isolated from the polysilicon fill material on the bit line region.

Many benefits are achieved by way of the present invention over conventional techniques. For example, the present technique provides an easy to use process that relies upon conventional technology. In some embodiments, the method provides higher device yields in dies per wafer. Additionally, the method provides a process that is compatible with conventional process technology without substantial modifications to conventional equipment and processes. Preferably, the invention provides for an improved process integration for design rules of 0.13 microns or less. Additionally, pitch between the transistor gate structures can be less than 0.135 microns. Preferably, the invention provides a self-aligned contact formation process for DRAMs and other integrated circuit devices. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF THE INVENTION

Figure 1:
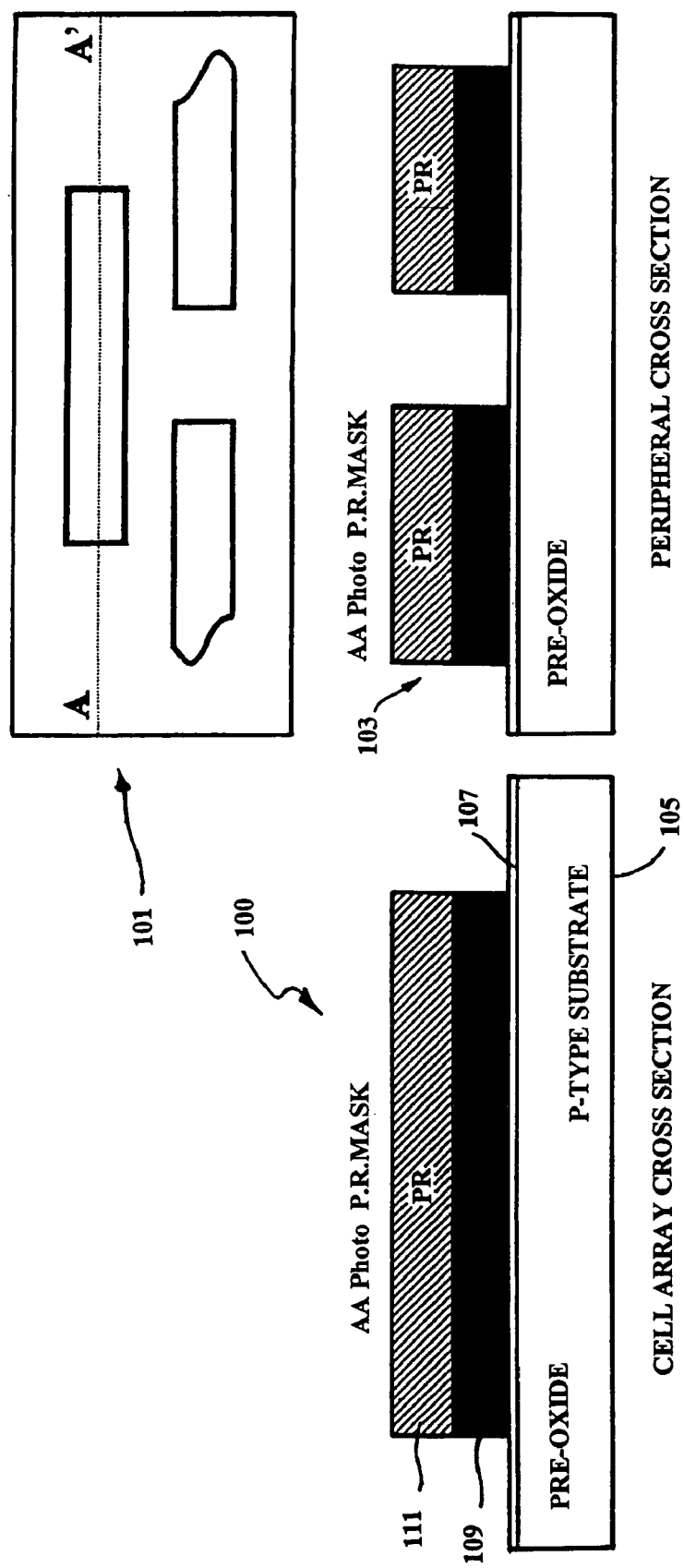
FIGS. 1 through 9 illustrate a method for forming an interconnect structure for a dynamic random access memory device according to an embodiment of the present invention.

According to the present invention, techniques for processing integrated circuits for the manufacture of semiconductor devices are provided. More particularly, the invention provides a method and structures for manufacturing an interconnect structure having for dynamic random access memory devices, commonly called DRAMs. But it would be recognized that the invention has a much broader range of applicability.

A method for fabricating an interconnect structure for a dynamic random access memory device according to an embodiment of the present invention may be outlined as follows:

1. Provide a substrate, which has a bit line region and a capacitor contact region.
2. Form at least a first gate structure and a second gate structure overlying the substrate.
3. Form a conformal dielectric layer overlying the first gate structure, the second gate structure, the bit line region, and the capacitor contact region.
4. Form an interlayer dielectric material overlying the conformal dielectric layer.
5. Planarize the interlayer dielectric material
6. Form a masking layer overlying the planarized interlayer dielectric material;.
7. Expose a continuous common region within a portion of the planarized interlayer dielectric material overlying a portion of the first gate structure, a portion of the second gate structure, a portion of the bit line region, and a portion of the capacitor contact region;
8. Perform a first etching process to remove the exposed portion of the planarized interlayer dielectric layer.
9. Perform a second etching process to remove a portion of the conformal dielectric layer on the bit line region and to remove a portion of the conformal dielectric layer on the capacitor contact region while using other portions of the conformal layer as a mask to prevent a portion of the first gate structure and a portion of the second gate structure from being exposed.
10. Deposit a polysilicon fill material within the continuous common region and overlying the bit line region, the capacitor contact region, the first gate structure, and the second gate structure to cover portions of the bit line region, the capacitor contact region, the first gate structure, and the second gate structure to a predetermined thickness;
11. Planarize the polysilicon fill material to reduce the predetermined thickness and to simultaneously reduce a thickness of a portion of the interlayer dielectric material;
12. Continue planarization of the polysilicon fill material and the interlayer dielectric material;
13. Expose a portion of the first gate structure and a portion of the second gate structure while leaving portions of the polysilicon fill material on the portion of the capacitor contact region and the portion of the bit line region, whereupon the polysilicon fill material on the portion of the capacitor contact region is isolated from the polysilicon fill material on the portion of the bit line region; and
14. Perform other steps, as desired.

The above sequence of steps provides a method according to an embodiment of the present invention. As shown, the method uses a combination of steps including a way of forming an interconnect structure for a dynamic random access memory device. Other alternatives can also be provided where steps are added, one or more steps are removed, or one or more steps are provided in a different sequence without departing from the scope of the claims herein. Further details of the present method can be found throughout the present specification and more particularly below.

FIGS. 1 through 9 illustrate a method for forming an interconnect structure for a dynamic random access memory device according to an embodiment of the present invention. These diagrams are merely examples, which should not unduly limit the scope of the claims herein. One of ordinary skill in the art would recognize many variations, alternatives, and modifications. We will explain the present method using two cross-sectional view diagrams including a cell array cross-section 100 and a peripheral cross-section 103. A top-view diagram 101 of the cell array cross section is also shown. As shown, the method begins providing a substrate 105, an example of the substrate is a semiconductor wafer. In a specific embodiment, the substrate is a P-type silicon wafer, but can be others. The substrate includes an overlying oxide layer 107, which has a patterned nitride layer 109. The patterned nitride layer has patterned photoresist mask 111. Certain process details are provided as follows:

1. Provide P-type 100 silicon wafer, including an epitaxial layer;
2. Pre-clean using RCA clean, including SC1 and SC2;
3. Form pad oxide;
4. Form silicon nitride layer;
5. Clean silicon nitride layer using RCA clean;
6. Form sacrificial oxide;
7. Pattern silicon nitride; and
8. Strip photoresist film.

Figure 2:
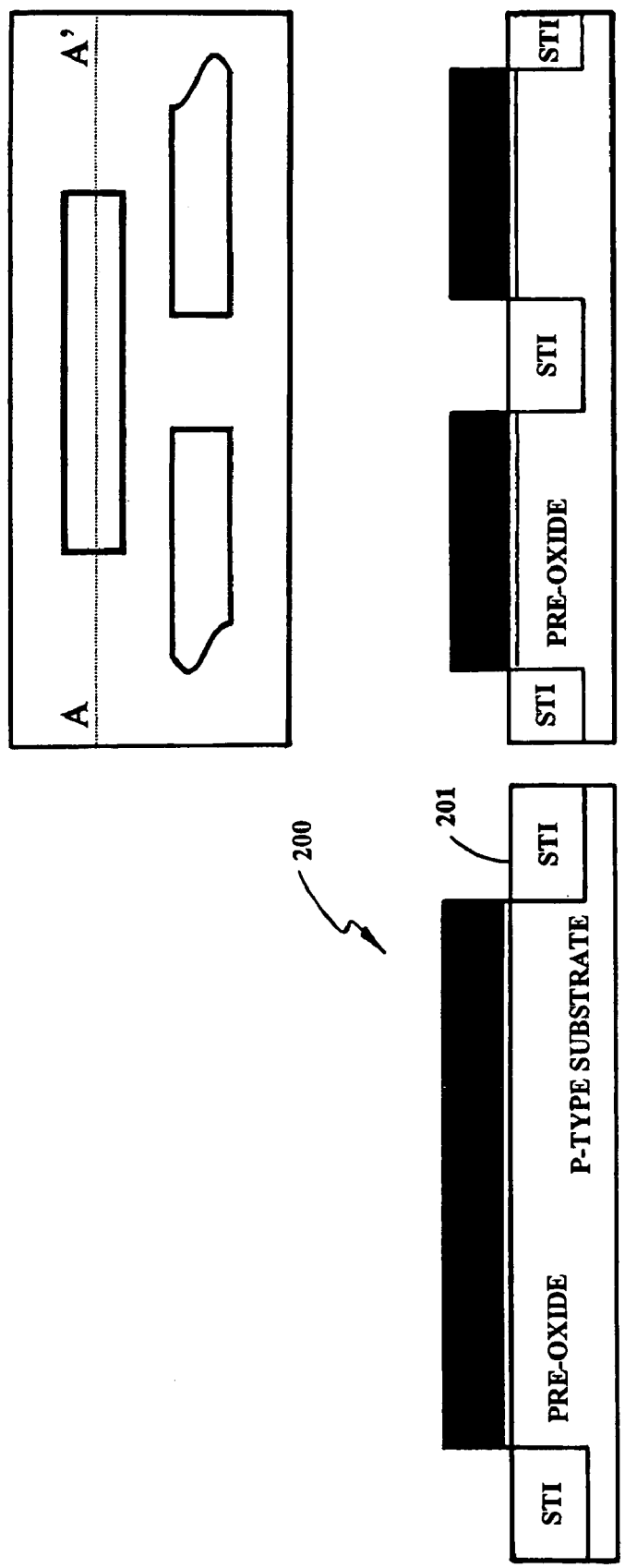
Figure 3:
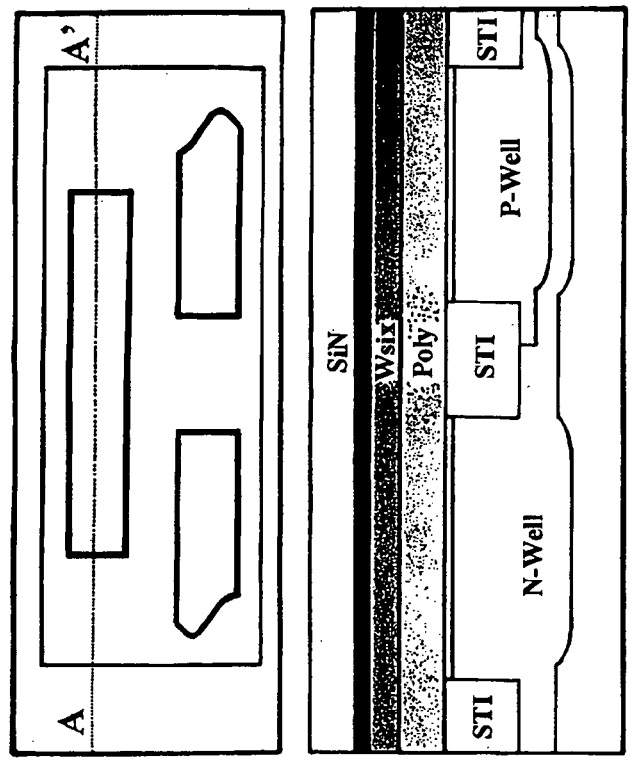
Figure 3:
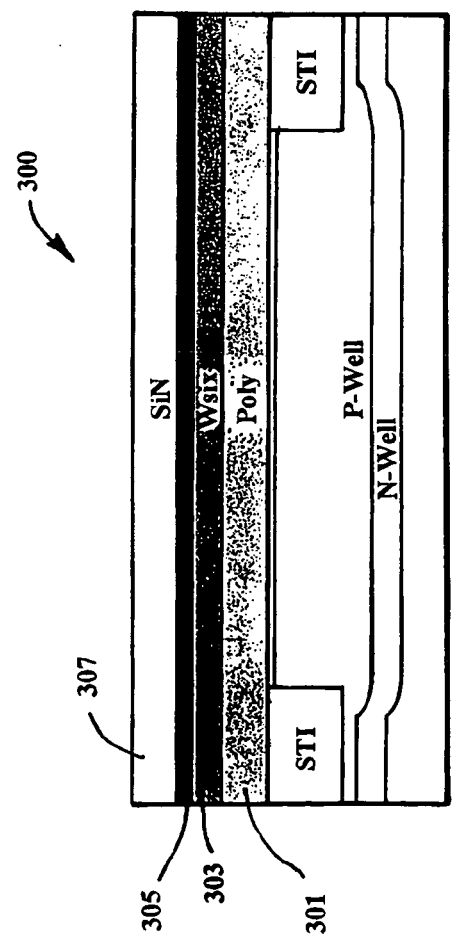
Figure 4:
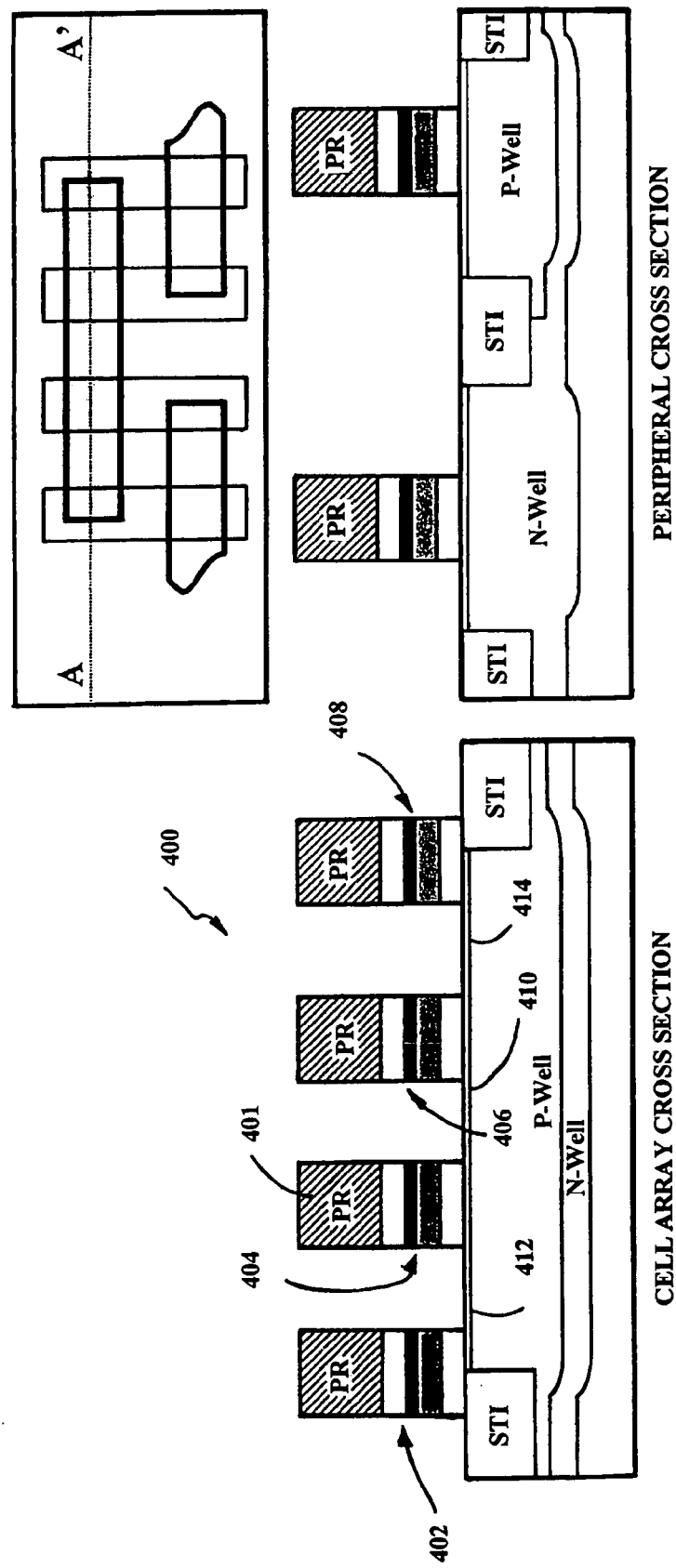

Referring to FIG. 2, the method forms shallow trench isolation regions 201 using a silicon nitride hard mask layer. The resulting structure 200 is shown. Shallow trench isolation regions are provided in both cell and peripheral regions. The method forms a stack layer 300 that will be defined to form gate structures. The stack layer includes polysilicon layer 301, an overlying tungsten silicide layer 303, an overlying antireflective coating 305, and an overlying silicon nitride layer 307. Referring to FIG. 4, the method forms which has a cell region and a peripheral region. The method forms at least a first gate structure 402, a second gate structure 404, a third gate structure 406, and a fourth gate structure 408 in the cell region and forms gate structures in the peripheral region. A photoresist layer 401 patterns such gate structures using conventional etching techniques. As shown, each of the gate structures has an overlying cap layer, which protects it. The second gate structure is spaced by a bit line region 410 to the third gate structure. The first gate structure is spaced by a first capacitor contact region 412 to the second gate structure. The third gate structure is spaced by a second capacitor contact region 414 to the fourth gate structure. As shown, each of these structures are provided on P-type or N-type well regions. A triple well structure is shown. Other well structures can also be used depending upon the application.

Figure 5:
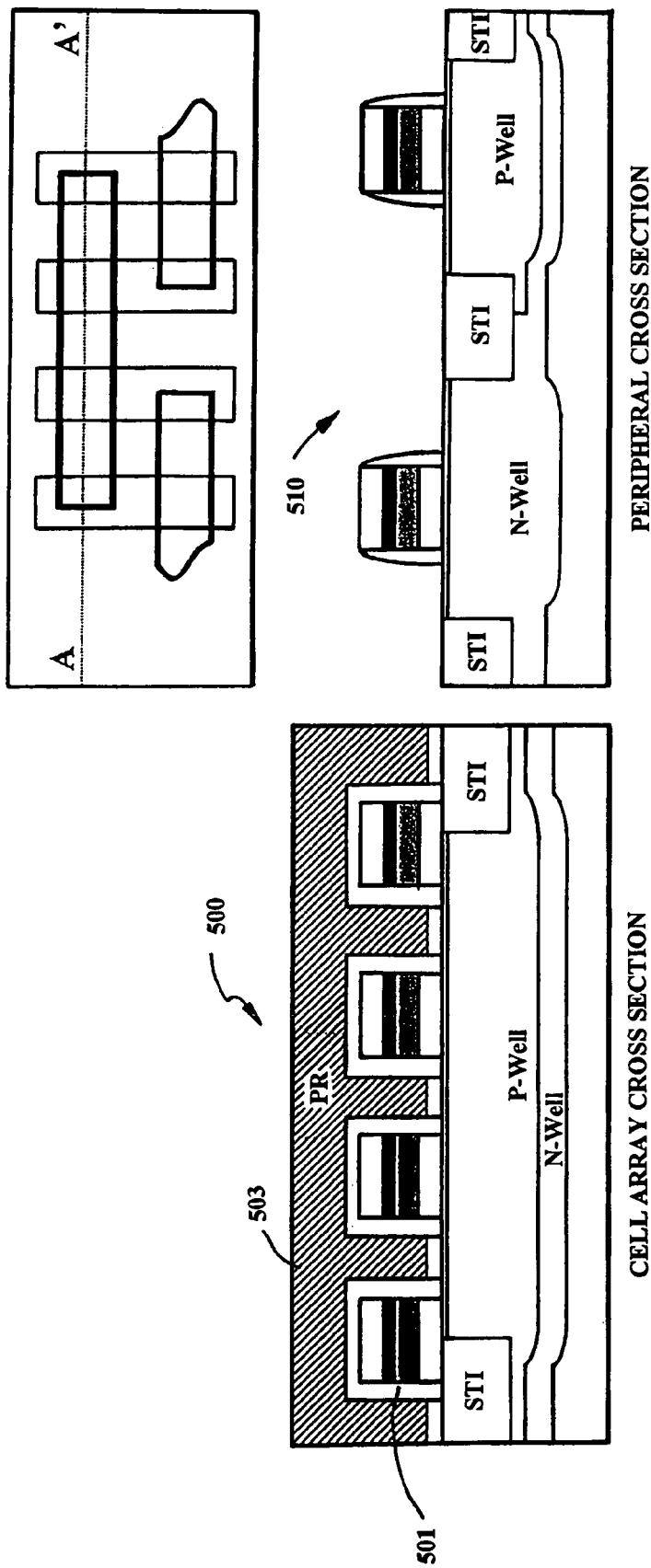

The method forms a conformal dielectric layer 501 (e.g., silicon nitride, silicon oxide, or any combination of these) overlying the first gate structure, the second gate structure, the third gate structure, the fourth gate structure, the bit line region, the first capacitor contact region, and the second capacitor contact region in the cell region and the gate structure in the peripheral region as shown in FIG. 5. The cell layer is covered using photoresist 503. An anisotropic etching technique is used in the peripheral region 510 to define sidewall spacers on each of the gate structures. The etching technique also removes a portion of the conformal dielectric layer overlying portions of the source/drain regions coupled to each of the gate structures for the MOS transistors. The method strips the photoresist layer in the cell region.

Figure 6:
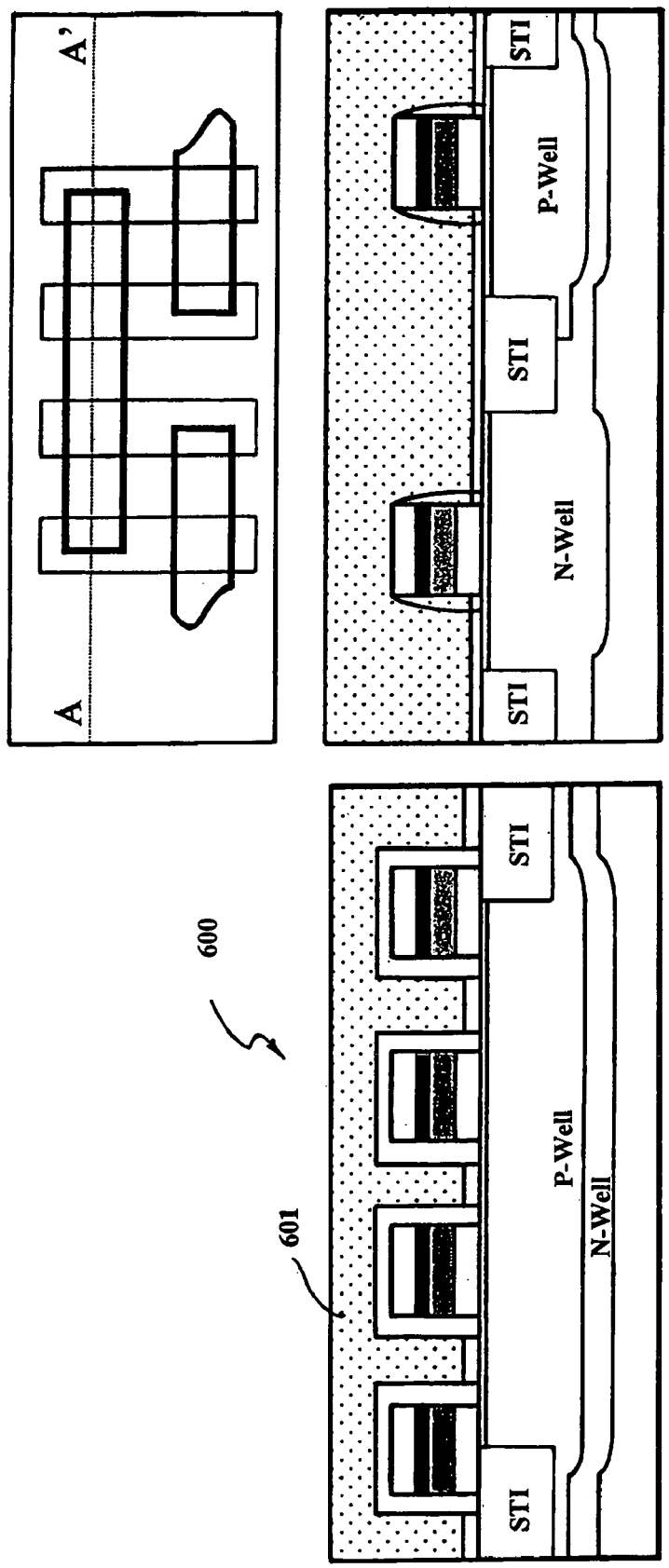

Referring to FIG. 6, the method includes forming an interlayer dielectric material 601 overlying the conformal dielectric layer in the cell region and overlying the MOS transistor structures in the peripheral region. Preferably, the dielectric layer can be oxide, doped oxide (e.g., BPSG, PSG), and other materials including multiple layers of materials. Preferably, the method planarizes the surface of the dielectric material. Any combination of etching and/or chemical mechanical planarization techniques may be used, depending upon the application.

Figure 7:
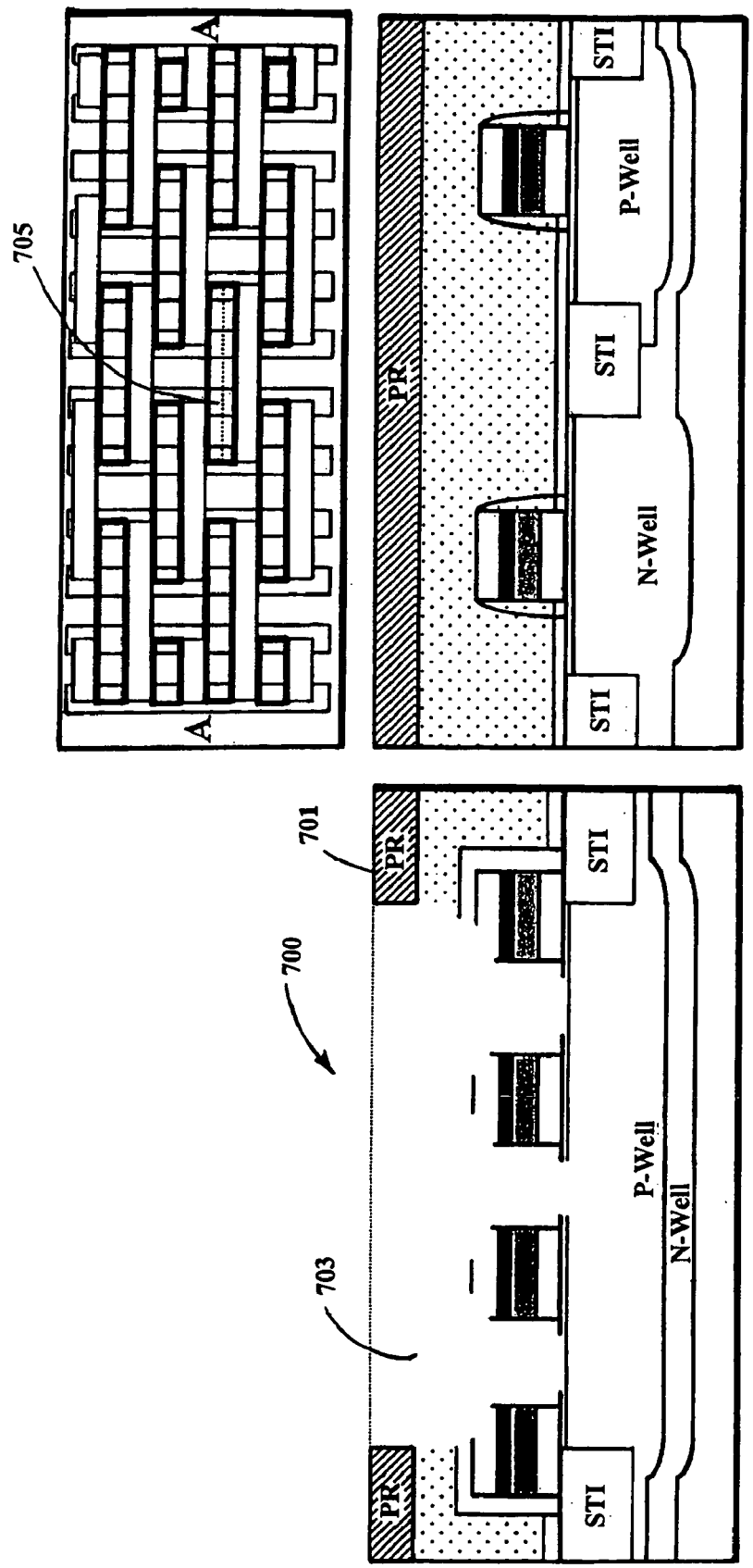

A masking layer 701 is formed overlying the planarized interlayer dielectric material 700 as illustrated by FIG. 7. The masking layer exposes a continuous common region 703 within a portion of the planarized interlayer dielectric material overlying the first gate structure, the second gate structure, the third gate structure, the fourth gate structure, the bit line region, the first capacitor contact region, and the second capacitor contact region while maintaining the planarized interlayer dielectric material overlying the gate structure in the peripheral region. That is, the masking layer covers and protects the interlayer dielectric material and underlying structures in the peripheral region, as shown. The method includes performing an etching process to remove 703 the exposed portion of the planarized interlayer dielectric layer in the continuous common region to expose the bit line contact, the first capacitor contact region, and the second capacitor contact region while using portions of the conformal layer as a mask to prevent any conductive portions of the first gate structure, the second gate structure, the third gate structure, and the fourth gate structure from being exposed. As shown, the conformal layer has been removed from contact regions, e.g., bit line, capacitor. As also shown, the interlayer dielectric material still remains over portions of the first gate structure and the second gate structure. Also, portions of the conformal layer and cap layer act as stop layers for each of the gate structures to prevent conductive regions of the gate structures from being exposed in certain embodiments. A simplified top view of a plurality of cells 705 in a cell array is also shown.

Figure 8:
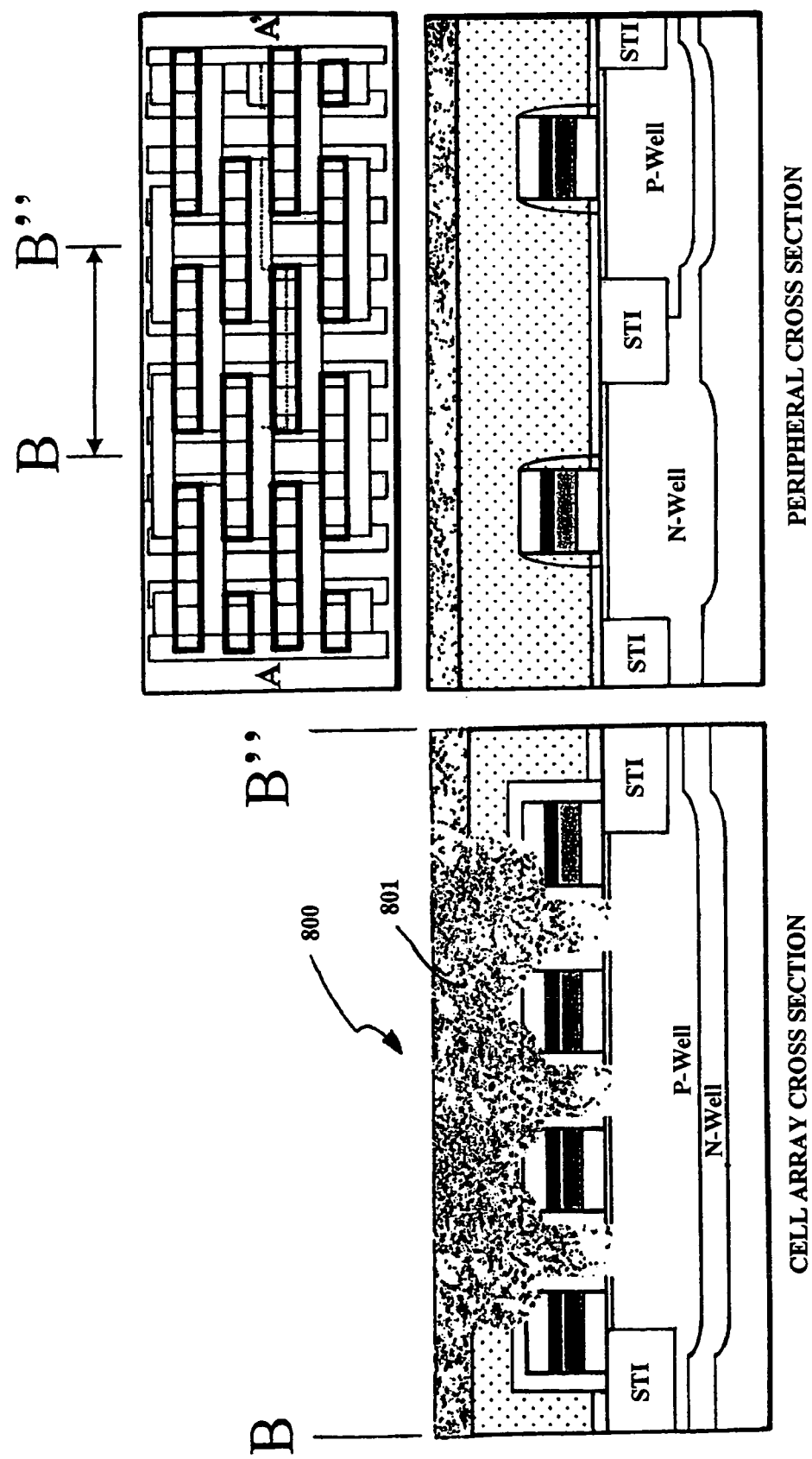

Referring to FIG. 8, the method deposits a polysilicon fill material 801 (e.g., polysilicon, doped polysilicon, in-situ doped polysilicon, in-situ doped amorphous silicon, amorphous silicon) within the continuous common region. Preferably, the fill material is overlying the bit line region, the first capacitor contact region, and the second capacitor region, the first gate structure, the second gate structure, the third gate structure, and the fourth gate structure to a predetermined thickness. That is, the polysilicon fill material grows over portions of the interlayer dielectric material as shown. As previously noted, portions of the conformal layer and cap layer prevent the polysilicon layer from coming in physical contact with the conductive regions of the gate structures to electrically isolate these structures from each other to prevent shorts, etc.

Figure 9:
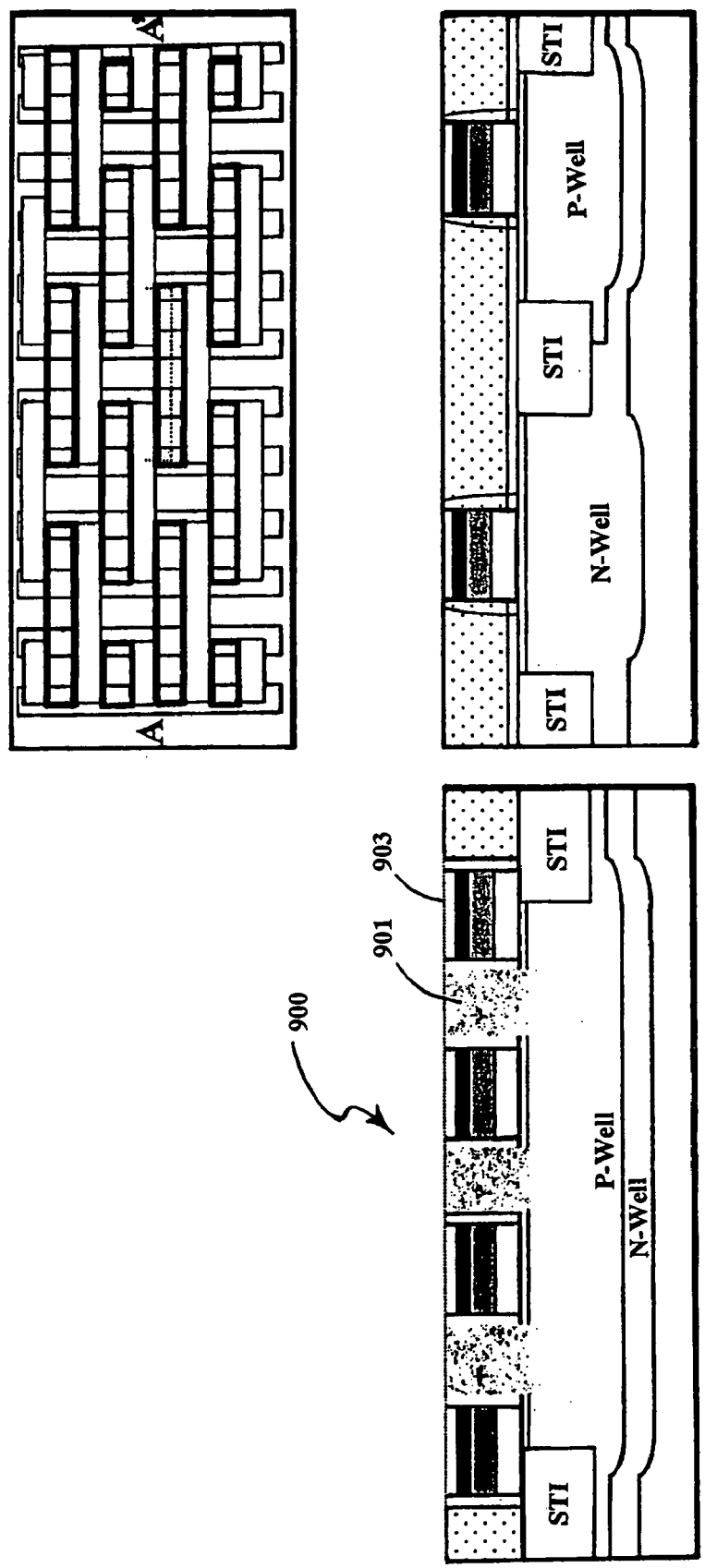

The polysilicon fill material is planarized 900 to reduce the predetermined thickness of the polysilicon material, as illustrated by FIG. 9. Planarization also simultaneously reduces a thickness of a portion of the interlayer dielectric material to level within a vicinity of an upper region of the first gate structure, the second gate structure, the third gate structure, the fourth gate structure, and the gate structure. The method continues the planarization of the polysilicon fill material and the interlayer dielectric material to expose a portion of the first gate structure, a portion of the second gate structure, a portion of the third gate structure, a portion of the fourth gate structure, and a portion of the gate structure while leaving portions of the polysilicon fill material on the bit line region, the first capacitor contact region and the second capacitor contact region. The polysilicon fill material on the first capacitor contact region is isolated from the polysilicon fill material on the bit line region and the polysilicon fill material 901 on the second capacitor contact region is isolated from the polysilicon fill material on the bit line region. As also shown, the interlayer dielectric material has a thickness that is substantially the same as the gate structures (903 shown as an example of a gate structures) and portions of polysilicon fill material. Depending upon the embodiment, there can be many variations, alternatives, and modifications.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for forming bit line and storage node contacts for a dynamic random access device, the method comprising:
   providing a substrate, the substrate having a bit line region and a capacitor contact region;
   forming at least a first gate structure and a second gate structure overlying the substrate, the first gate structure including an overlying first cap, the second gate structure including an overlying second cap, the first gate structure being spaced by the bit line region to the second gate structure, the capacitor contact region being coupled to the first gate structure;
   forming a conformal dielectric layer overlying the first gate structure, the second gate structure, the bit line region, and the capacitor contact region;
   forming an interlayer dielectric material overlying the conformal dielectric layer;
   planarizing the interlayer dielectric material;
   forming a masking layer overlying the planarized interlayer dielectric material;
   exposing a continuous common region within a portion of the planarized interlayer dielectric material overlying a portion of the first gate structure, a portion of the second gate structure, a portion of the bit line region, and a portion of the capacitor contact region;
   performing a first etching process to remove the exposed portion of the planarized interlayer dielectric layer;
   performing a second etching process to remove a portion of the conformal dielectric layer on the bit line region, a portion of the conformal dielectric layer on the capacitor contact region;
   using other portions of the conformal dielectric layer as a mask to prevent a portion of the first gate structure and a portion of the second gate structure from being exposed during the second etching process;
   depositing a polysilicon fill material within the continuous common region and overlying the bit line region, the capacitor contact region, the first gate structure, and the second gate structure to cover portions of the bit line region, the capacitor contact region, the first gate structure, and the second gate structure to a predetermined thickness;
   planarizing the polysilicon fill material to reduce the predetermined thickness and to simultaneously reduce a thickness of a portion of the interlayer dielectric material;
   continuing the planarization of the polysilicon fill material and the interlayer dielectric material; and
   exposing a portion of the first gate structure and a portion of the second gate structure while leaving portions of the polysilicon fill material on the portion of the capacitor contact region and the portion of the bit line region;
   whereupon the other portion of the conformal dielectric layer prevent the polysilicon fill material from coming in physical contact with either at least the first gate structure or at least the second gate structure; and
   whereupon the polysilicon fill material on the portion of the capacitor contact region is isolated from the polysilicon fill material on the portion of the bit line region.

2. The method of claim 1 wherein the first gate structure including an overlying first tungsten silicide layer and the second gate structure including an overlying second tungsten silicide layer.

3. The method of claim 1 wherein the conformal dielectric layer is silicon nitride.

4. The method of claim 1 wherein the planarizing includes a chemical mechanical polishing process and/or an etch back process.

5. The method of claim 1 wherein the polysilicon fill material is an in-situ doped polysilicon material or an amorphous silicon material or an in-situ-doped amorphous silicon material or a polysilicon material or a doped polysilicon material.

6. The method of claim 1 wherein the polysilicon fill material in the portion of capacitor contact region is electrically isolated from the first gate structure and the second gate structure and the polysilicon fill material in the portion of the bit line region is electrically isolated from the first gate structure and the second gate structure.

7. The method of claim 1 wherein the continuous common region is shaped as an "I" configuration.

8. The method of claim 1 wherein the continuous common region is shaped as a "T" configuration.

9. The method of claim 1 wherein the first gate structure and the second gate structure are spaced by the bit line region, the space being about 0.135 microns or less.

10. The method of claim 1 wherein the first gate structure is characterized by a design dimension of 0.13 micron and less the second gate structure is characterized by a design dimension of 0.13 micron or less.

11. A method for forming a self aligned contact region for a dynamic random access memory device, the method comprising:
    providing a semiconductor substrate, the semiconductor substrate having a cell region and a peripheral region;
    forming at least a first gate structure, a second gate structure, a third gate structure, and a fourth gate structure in the cell region and forming a gate structure in the peripheral region, the first gate structure including an overlying first cap, the second gate structure including an overlying second cap, the third gate structure including an overlying third cap structure, the fourth gate structure including an overlying fourth cap structure, the second gate structure being spaced by a bit line region to the third gate structure, the first gate structure being spaced by a first capacitor contact region to the second gate structure, the third gate structure being spaced by a second capacitor contact region to the fourth gate structure;

forming a conformal dielectric layer overlying the first gate structure, the second gate structure, the third gate structure, the fourth gate structure, the bit line region, the first capacitor contact region, and the second capacitor contact region in the cell region and the gate structure in the peripheral region;

forming an interlayer dielectric material overlying the conformal dielectric layer;

planarizing the interlayer dielectric material;

forming a masking layer overlying the planarized interlayer dielectric material;

exposing a continuous common region within a portion of the planarized interlayer dielectric material overlying the first gate structure, the second gate structure, the third gate structure, the fourth gate structure, the bit line region, the first capacitor contact region, and the second capacitor contact region while maintaining the planarized interlayer dielectric material overlying the gate structure in the peripheral region;

performing an etching process to remove the exposed portion of the planarized interlayer dielectric layer in the continuous common region to expose the bit line contact, the first capacitor contact region, and the second capacitor contact region;

using other portions of the conformal dielectric layer as a mask to prevent any conductive portions of the first gate structure, the second gate structure, the third gate structure, and the fourth gate structure from being exposed during the second etching process;

depositing a polysilicon fill material within the continuous common region and overlying the bit line region, the first capacitor contact region, and the second capacitor region, the first gate structure, the second gate structure, the third gate structure, and the fourth gate structure to a predetermined thickness;

planarizing the polysilicon fill material to reduce the predetermined thickness and to simultaneously reduce a thickness of a portion of the interlayer dielectric material to a vicinity of an upper region of the first gate structure, the second gate structure, the third gate structure, the fourth gate structure, and the gate structure;

continuing the planarization of the polysilicon fill material and the interlayer dielectric material; and exposing a portion of the first gate structure, a portion of the second gate structure, a portion of the third gate structure, a portion of the fourth gate structure, and a portion of the gate structure while leaving portions of the polysilicon fill material on the bit line region, the first capacitor contact region and the second capacitor contact region;

whereupon the other portions of the conformal dielectric layer prevent the polysilicon fill material from coming in physical contact with the first gate structure or the second gate structure or the third gate structure, or the fourth gate structure; and whereupon the polysilicon fill material on the first capacitor contact region is isolated from the polysilicon fill material on the bit line region and the polysilicon fill material on the second capacitor contact region is isolated from the polysilicon fill material on the bit line region.

12. The method of claim 11 wherein the first gate structure including an overlying first tungsten silicide layer and the second gate structure including an overlying second tungsten silicide layer, the third gate structure including an overlying third tungsten layer, the fourth gate structure including an overlying fourth tungsten silicide layer, and the gate structure including an overlying tungsten silicide layer.

13. The method of claim 11 wherein the conformal dielectric layer comprises silicon nitride.

14. The method of claim 11 wherein the planarizing includes a chemical mechanical polishing process and/or an etch back process.

15. The method of claim 11 wherein the polysilicon fill material is an in-situ doped polysilicon material or an amorphous silicon material or an in-situ-doped amorphous silicon material or a polysilicon material or a doped polysilicon material.

16. The method of claim 11 wherein the polysilicon fill material in the first capacitor contact region is electrically isolated from the first gate structure and the second gate structure; wherein the polysilicon fill material in the bit line region is electrically isolated from the second gate structure and the third gate structure; and wherein the second capacitor contact region is electrically isolated from the third gate structure and the fourth gate structure.

17. The method of claim 11 wherein the continuous common region is shaped as an "I" configuration.

18. The method of claim 11 wherein the continuous common region is shaped as a "T" configuration.

19. The method of claim 11 wherein the second gate structure and the third gate structure are spaced by the bit line region, the space being about 0.135 microns or less; and wherein the first gate structure, the second gate structure, the third gate structure, and the fourth gate structure is characterized by a design dimension of 0.13 micron or less.

* * * * *